US 8,357,925 B2

(12) United States Patent
Chung et al.

(10) Patent No.: US 8,357,925 B2
(45) Date of Patent: *Jan. 22, 2013

(54) OPTOELECTRONIC DEVICE BASED ON NON-POLAR AND SEMI-POLAR ALUMINUM INDIUM NITRIDE AND ALUMINUM INDIUM GALLIUM NITRIDE ALLOYS

(75) Inventors: Roy B. Chung, Goleta, CA (US); Zhen Chen, Goleta, CA (US); James S. Speck, Goleta, CA (US); Steven P. DenBaars, Goleta, CA (US); Shuji Nakamura, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/300,977

(22) Filed: Nov. 21, 2011

(65) Prior Publication Data

US 2012/0061645 A1    Mar. 15, 2012

Related U.S. Application Data

(63) Continuation of application No. 12/610,945, filed on Nov. 2, 2009, now Pat. No. 8,084,763.

(60) Provisional application No. 61/110,449, filed on Oct. 31, 2008.

(51) Int. Cl.
*H01L 29/06* (2006.01)
*H01L 31/00* (2006.01)

(52) U.S. Cl. ............ 257/13; 257/14; 257/94; 257/103; 257/E33.034; 438/47

(58) Field of Classification Search ............ 257/13, 257/14, 94, 103, E33.034; 438/47
See application file for complete search history.

(56) References Cited

U.S. PATENT DOCUMENTS

| 3,982,261 | A | 9/1976 | Antypas |
| 4,616,241 | A | 10/1986 | Biefeld et al. |
| 6,046,464 | A | 4/2000 | Schetzina |
| 8,084,763 | B2 * | 12/2011 | Chung et al. ............ 257/13 |
| 2003/0116767 | A1 | 6/2003 | Kneissl et al. |
| 2005/0218414 | A1 | 10/2005 | Ueda et al. |
| 2007/0086916 | A1 * | 4/2007 | LeBoeuf et al. ............ 422/58 |
| 2007/0111488 | A1 | 5/2007 | Chakraborty et al. |
| 2008/0108162 | A1 | 5/2008 | Dwilinski et al. |
| 2009/0081857 | A1 | 3/2009 | Hanser et al. |

OTHER PUBLICATIONS

International Search Report dated Dec. 29, 2009, International application No. PCT/US2009/062982, International filing date Nov. 2, 2009.
Kamber, D. et al., "Lateral epitaxial overgrowth of aluminum nitride on patterned silicon carbide substrates by hydride vapor phase epitaxy," Applied Physics Letters 90, 2007, pp. 122116-1-122116-3.
Hirayama, H. et al., "231-261 nm AlGaN deep-ultraviolet light-emitting diodes fabricated on AlN multilayer buffers grown by ammonia pulse-flow method on sapphire," Applied Physics Letters 91, 2007, pp. 071901-1-071901-3.
Hirayama, H., "Quaternary InAlGaN-based high-efficiency ultraviolet light-emitting diodes," Journal of Applied Physics 97, 2005, pp. 091101-1-091101-19.

(Continued)

*Primary Examiner* — Tu-Tu Ho
(74) *Attorney, Agent, or Firm* — Gates & Cooper LLP (57) ABSTRACT

A high-power and high-efficiency light emitting device with emission wavelength ($\lambda_{peak}$) ranging from 280 nm to 360 nm is fabricated. The new device structure uses non-polar or semi-polar AlInN and AlInGaN alloys grown on a non-polar or semi-polar bulk GaN substrate.

27 Claims, 3 Drawing Sheets

OTHER PUBLICATIONS

Nishida, T. et al., "Submilliwatt operation of AlGaN-based ultraviolet light-emitting diode using short-period alloy superlattice," Applied Physics Letters, vol. 78, No. 4, Jan. 22, 2001, pp. 399-400.

Slack, G. et al., "Growth of high purity AlN crystals," Journal of Crystal Growth 34, 1976, pp. 263-279.

Chung, R. et al., "Effect of growth conditions on Indium incorporation during AlInN growth by MOCVD and characterization," 36th International Symposium on Compound Semiconductors, Santa Barbara CA, Aug. 2009, one page.

* cited by examiner

OPTOELECTRONIC DEVICE BASED ON NON-POLAR AND SEMI-POLAR ALUMINUM INDIUM NITRIDE AND ALUMINUM INDIUM GALLIUM NITRIDE ALLOYS

CROSS REFERENCE TO RELATED APPLICATIONS

This application is a continuation of and claims the benefit under 35 U.S.C. Section 120 of the following co-pending and commonly-assigned U.S. application:

U.S. Utility application Ser. No. 12/610,945, filed on Nov. 2, 2009, by Roy B. Chung, Zhen Chen, James S. Speck, Steven P. DenBaars, and Shuji Nakamura, entitled "OPTOELECTRONIC DEVICE BASED ON NON-POLAR AND SEMI-POLAR ALUMINUM INDIUM NITRIDE AND ALUMINUM INDIUM GALLIUM NITRIDE ALLOYS,", which application claims the benefit under 35 U.S.C. Section 119(e) of U.S. Provisional Application Ser. No. 61/110,449, filed on Oct. 31, 2008, by Roy B. Chung, Zhen Chen, James S. Speck, Steven P. DenBaars, and Shuji Nakamura, entitled "OPTOELECTRONIC DEVICE BASED ON NON-POLAR AND SEMI-POLAR ALUMINUM INDIUM NITRIDE AND ALUMINUM INDIUM GALLIUM NITRIDE ALLOYS,", both of which applications are incorporated by reference herein.

BACKGROUND OF THE INVENTION

1. Field of the Invention

This invention relates to nitride-based optoelectronic devices and a method of fabricating the same.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

Nitride-based optoelectronics have been extensively studied for fabrication of visible and ultra-violet (UV) light emitting devices. These devices typically have one or more layers of ternary alloys (InGaN, AlGaN, and AlInN), or quaternary alloy (AlInGaN). Continued developments in nitride-based optoelectronic devices have resulted in high-power and high-efficiency light emitting diodes (LEDs) and laser diodes (LDs), especially in the visible spectrum. However, high-power and high-efficient LEDs and LDs in the deep UV (DUV) region of the spectrum (emitting light with less than roughly 360 nm wavelengths) have not been achieved due to the difficulties in the growth, and thus poor material quality, and the absence of a bulk aluminum nitride (AlN) substrate.

For a nitride-based UV light emitting devices with peak emission wavelength ($\lambda_{peak}$) less than 360 nm, conventional LEDs and LEDs comprise of multiple AlGaN layers and an AlN buffer layer, which are normally grown on either sapphire or 6H—SiC substrates. Because of this heteroepitaxial growth, AlN or AlGaN buffer layers bear a dislocation density on the order of $10^{10}$ cm$^{-2}$, and the dislocations propagate through the subsequent layers, resulting in poor material quality.

For indium containing alloys such as InGaN, it is commonly acknowledged that the indium clustering provides highly efficient radiative recombination sites for the carriers, and thus the performance of the device is rather insensitive to the dislocations. In contrast, AlGaN-based devices are sensitive to the dislocation density due to the absence of the indium clustering, and therefore the performance of AlGaN-based devices is directly affected by the number of the dislocations.

To reduce the dislocation density, various structures and growth techniques have been studied. For example, a superlattice structure is grown between a buffer layer and cladding layer, in which the superlattice filters out the dislocations propagating from the buffer layer and is also known to relieve the strain built in from the lattice mismatch. This structure improved the device performance of UV LEDs. The growth techniques used in a metal organic chemical vapor deposition (MOCVD), such as a NH$_3$ flow modulated AlN growth, have successfully improved the quality of the AlN buffer layer. Bulk AlN crystals have been achieved by hydride vapor phase epitaxy (HVPE) and physical vapor transport (PVT). See References [1-4].

Even with a high quality AlN buffer layer or a bulk AlN substrate, the AlGaN-based device still suffers from the undesirable quantum-confined Stark effect (QCSE) as long as a device is grown along a c-direction in which a strong spontaneous polarization exists. Lattice mismatch between layers will induce piezoelectric polarization, which could enhance the degree of the polarization. The strong built-in electric fields from the polarizations cause spatial separation between electrons and holes, that in turn give rise to restricted carrier recombination efficiency, reduced oscillator strength, and red-shifted emission. The built-in electric field becomes stronger with higher Al composition.

To summarize, conventional AlGaN-based UV light emitting devices suffer from high dislocation density due to the absence of a bulk AlN substrate, and from QCSE which reduces the radiative recombination efficiency.

To circumvent the problem of dislocations, AlInGaN quaternary alloys have been introduced in UV light emitting devices, wherein the indium clustering is expected to improve the device performance. It has been shown that the photoluminescence (PL) emission intensity of AlInGaN-based LEDs is approximately one to two orders of magnitude higher than that of AlGaN-based LEDs. [5] However, the internal quantum efficiency (IQE) of AlInGaN-based LEDs is still around 15%, which is significantly lower than that of InGaN (50%-70%). The external quantum efficiency is still too low (~1%) to realize commercially feasible UV emitting devices [5].

SUMMARY OF THE INVENTION

To overcome the limitations in the prior art described above, and to overcome other limitations that will become apparent upon reading and understanding the present invention, the present invention describes a method for fabricating a high-power and high-efficiency light emitting device with a peak emission wavelength ($\lambda_{peak}$) ranging from 280 nm to 360 nm. The present invention also introduces a new device structure using non-polar or semi-polar AlInN and AlInGaN alloys grown on a non-polar or semi-polar bulk (free standing) GaN substrate.

In one embodiment, the present invention is an optoelectronic device (e.g., LED or LD), comprising one or more light emitting layers containing at least Aluminum (Al), Indium (In), and Nitrogen (N), grown or fabricated on a non-polar or semi-polar GaN substrate, wherein the light emitting layers are non-polar or semi-polar layers.

The optoelectronic device may further comprise one or more $Al_xIn_{1-x}N$ or $Al_yIn_zGa_{1-y-z}N$ layers closely lattice-matched to the non-polar or semi-polar GaN substrate. The closely lattice matched layers may be one or more $Al_xIn_{1-x}N$ or $Al_yIn_zGa_{1-y-z}N$ layers doped with silicon (Si) for n-type conductivity (e.g., an n-type cladding layer doped with Si). The device may further comprise one or more $Al_xIn_{1-x}N$ or $Al_yIn_zGa_{1-y-z}N$ layers doped with Mg for p-type conductivity (e.g., p-type cladding layer doped with magnesium), on the light emitting active layers. The plurality of $Al_xIn_{1-x}N$ or $Al_yIn_zGa_{1-y-z}N$ layers, and the light emitting active layers, may form one or more hetero structures, and the light emitting active layers may form one or more quantum-well heterostructures. In the above, $0 \leq y \leq 1$, $0 \leq z \leq 1$, and $0 \leq y+z \leq 1$.

An indium composition of one or more of the $Al_xIn_{1-x}N$ or $Al_yIn_zGa_{1-y-z}N$ layers (typically the active layer) may range from 10% to 30%.

For example, a light emitting device may comprise (a) an $Al_xIn_{1-x}N$ or $Al_yIn_zGa_{1-y-z}N$ based n-type cladding layer on the non-polar or semi-polar GaN substrate; (b) the one or more light emitting layers comprising an $Al_xIn_{1-x}N$ or $Al_yIn_zGa_{1-y-z}N$ based single quantum well (SQW) or multiple quantum well (MQW) on the n-type cladding layers; (c) one or more $Al_xIn_{1-x}N$ or $Al_yIn_zGa_{1-y-z}N$ based electron blocking layers on the quantum well layers; and (d) an $Al_xIn_{1-x}N$ or $Al_yIn_zGa_{1-y-z}N$ based p-type cladding layer on the electron blocking layers, (e) wherein the $Al_xIn_{1-x}N$ or $Al_yIn_zGa_{1-y-z}N$ layers are non-polar or semi-polar.

In another example, the optoelectronic device may comprise (a) an first (Al,In,Ga)N layer having a first conductivity type; (b) a second (Al,In,Ga)N layer having a second conductivity type; and (c) an (Al,In,Ga)N quantum-well structure comprising an (Al,In,Ga)N quantum well layer epitaxially on a non-polar or semi-polar plane of a first (Al,In,Ga)N quantum well barrier layer, and a second (Al,In,Ga)N quantum well barrier layer epitaxially on a non-polar or semi-polar plane of the (Al,In,Ga)N quantum well layer, wherein (1) the quantum well structure is epitaxially on a non-polar or semi-polar plane of the first (Al,In,Ga)N layer such that the (Al,In,Ga)N quantum well structure is between the first (Al,In,Ga)N layer and the second (Al,In,Ga)N layer, and (2) the quantum well has a thickness and (Al,In,Ga)N composition that emits electroluminescence having a peak wavelength less than 360 nanometers (nm). For example, the light emitting device may have a peak emission wavelength ranging from 280 nm to 360 nm.

The (Al,In,Ga)N quantum well structure may be epitaxially on an (Al,In,Ga)N layer, wherein the (Al,In,Ga)N layer has a dislocation density of an (Al,In,Ga)N layer that is grown epitaxially on, and closely lattice matched to, GaN. For example, the dislocation density may be less than $10^6$ cm$^{-2}$, which is the dislocation density expected from an underlying GaN substrate, and the (Al,In,Ga)N layer does not comprise a lateral epitaxial overgrowth. For example, "closely lattice-matched" is close enough that there is no relaxation of the film at the thicknesses grown. No relaxation means no more than the dislocations from the substrate.

The light emitting device may further comprise the (Al,In,Ga)N quantum well structure epitaxially on a non-polar or semi-polar plane of an (Al,In,Ga)N layer; and a dislocation density of the (Al,In,Ga)N layer that is sufficiently low, wherein the non-polar or semi-polar plane and the dislocation density achieve an internal quantum efficiency of the light emitting device of greater than 15% and an external quantum efficiency of the Light Emitting Device of greater than 1%.

The present invention further discloses a method of fabricating a deep ultraviolet light emitting device, comprising fabricating one or more $Al_xIn_{1-x}N$ or $Al_yIn_zGa_{1-y-z}N$ layers with $0 \leq y \leq 1$, $0 \leq z \leq 1$, and $0 \leq y+z \leq 1$ on a non-polar or semi-polar GaN substrate, wherein the $Al_xIn_{1-x}N$ or $Al_yIn_zGa_{1-y-z}N$ layers are non-polar or semi-polar. The method typically further comprises epitaxially growing one or more of the $Al_xIn_{1-x}N$ and $Al_yIn_zGa_{1-y-z}N$ layers on the non-polar or semi-polar GaN substrate so that the $Al_xIn_{1-x}N$ and $Al_yIn_zGa_{1-y-z}N$ layers are closely lattice-matched to the non-polar or semi-polar GaN substrate. The method may further comprise growing at least one of the $Al_xIn_{1-x}N$ and $Al_yIn_zGa_{1-y-z}N$ layers as a light emitting active layer with an indium composition ranging from 10% to 30%.

For example, the method may comprise epitaxially growing one of the $Al_xIn_{1-x}N$ or $Al_yIn_zGa_{1-y-z}N$ layers as a first $Al_xIn_{1-x}N$ or $Al_yIn_zGa_{1-y-z}N$ layer having a first conductivity type, on a non-polar or semi-polar plane of the GaN substrate so that the first $Al_xIn_{1-x}N$ or $Al_yIn_zGa_{1-y-z}N$ layer is closely lattice matched to the GaN substrate; epitaxially growing one of the $Al_xIn_{1-x}N$ or $Al_yIn_zGa_{1-y-z}N$ layers as a first $Al_xIn_{1-x}N$ or $Al_yIn_zGa_{1-y-z}N$ quantum well barrier layer, on a non-polar or semi-polar plane of the first $Al_xIn_{1-x}N$ or $Al_yIn_zGa_{1-y-z}N$ layer; epitaxially growing one of the $Al_xIn_{1-x}N$ or $Al_yIn_zGa_{1-y-z}N$ layers as an $Al_xIn_{1-x}N$ or $Al_yIn_zGa_{1-y-z}N$ quantum well layer, on a non-polar or semi-polar plane of the first $Al_xIn_{1-x}N$ or $Al_yIn_zGa_{1-y-z}N$ quantum well barrier layer, and to a thickness and an (Al,In,Ga)N composition that emits electroluminescence having a peak wavelength less than 360 nm; epitaxially growing one of the $Al_xIn_{1-x}N$ or $Al_yIn_zGa_{1-y-z}N$ layers as a second $Al_xIn_{1-x}N$ or $Al_yIn_zGa_{1-y-z}N$ quantum well barrier layer, on a non-polar or semi-polar plane of the $Al_xIn_{1-x}N$ or $Al_yIn_zGa_{1-y-z}N$ quantum well layer, thereby forming a quantum well structure comprising the $Al_xIn_{1-x}N$ or $Al_yIn_zGa_{1-y-z}N$ quantum well layer between the first $Al_xIn_{1-x}N$ or $Al_yIn_zGa_{1-y-z}N$ quantum well barrier layer and the second $Al_xIn_{1-x}N$ or $Al_yIn_zGa_{1-y-z}N$ quantum well barrier layer; and epitaxially growing one of the $Al_xIn_{1-x}N$ or $Al_yIn_zGa_{1-y-z}N$ layers, on the quantum well structure, as a second $Al_xIn_{1-x}N$ or $Al_yIn_zGa_{1-y-z}N$ layer having a second conductivity type.

BRIEF DESCRIPTION OF THE DRAWINGS

Referring now to the drawings in which like reference numbers represent corresponding parts throughout:

FIGS. 2(*a*), 2(*b*) and 2*c*) are cross-sectional schematics illustrating three possible MQW structures (×4 periods) for non-polar and semi-polar light emitting devices.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention describes a device structure that can be utilized for a high-power and high-efficiency LED and LD, in the wavelength ranging from 280 nm to 360 nm, using non-polar or semi-polar AlInN and AlInGaN grown on non-polar or semi-polar GaN. The salient feature of the structure is that the piezoelectric field is reduced, because AlInN and AlInGaN cladding layers can be closely lattice-matched to GaN. In the new structure, the spontaneous polarization is also minimized by growing in non-polar or semi-polar crystal orientations. With the relatively wide bandgap and the reduced spontaneous and piezoelectric polarization effects, an efficient non-polar or semi-polar AlInN and AlInGaN based light emitting device can replace conventional AlGaN-based light emitting devices.

The present invention can be used to fabricate an optoelectronic device emitting light in the wavelength ranging from 280 nm to 360 nm, for example. Deep UV LEDs produced by the present invention may be useful for water- and air-purification, and germicidal and biomedical instrumentation systems. LDs in the UV region can be realized, which will increase the capacity of optical storage devices. With LEDs emitting in the region of 350 nm and below, a high-power and high-efficient white LEDs with the phosphor coating may also be produced.

Nomenclature

The term "(Al,Ga,In)N" or III-Nitride as used herein is intended to be broadly construed to include respective nitrides of the single species, Al, Ga, and In, as well as binary, ternary and quaternary compositions of such Group III metal species. Accordingly, the term (Al, Ga, In)N comprehends the compounds AlN, GaN, and InN, as well as the ternary compounds AlGaN, GaInN, and AlInN, and the quaternary compound AlGaInN, as species included in such nomenclature. When two or more of the (Ga, Al, In) component species are present, all possible compositions, including stoichiometric proportions as well as "off-stoichiometric" proportions (with respect to the relative mole fractions present of each of the (Ga, Al, In) component species that are present in the composition), can be employed within the broad scope of the invention. Accordingly, it will be appreciated that the discussion of the invention hereinafter in reference to GaN materials is applicable to the formation of various other (Al, Ga, In)N material species. Further, (Al,Ga,In)N materials within the scope of the invention may further include minor quantities of dopants and/or other impurity or inclusional materials.

One approach to eliminating the spontaneous and piezoelectric polarization effects in Group-III nitride optoelectronic devices is to grow the devices on nonpolar planes of the crystal (e.g., along a non-polar crystal direction, along an a-axis or m-axis of III-Nitride). For example, in GaN crystals, such planes contain equal numbers of Ga and N atoms and are charge-neutral. Furthermore, subsequent nonpolar layers are equivalent to one another so the bulk crystal will not be polarized along the growth direction. Two such families of symmetry-equivalent nonpolar planes in GaN are the {11-20} family, known collectively as a-planes, and the {10-101} family, known collectively as m-planes.

Another approach to reducing polarization effects and effective hole masses in (Ga,Al,In,B)N devices is to grow the devices on semipolar planes of the crystal. The term "semi-polar plane" can be used to refer to any plane that cannot be classified as c-plane, a-plane, or m-plane. In crystallographic terms, a semipolar plane would be any plane that has at least two nonzero h, i, or k Miller indices and a nonzero l Miller index. Some commonly observed examples of semipolar planes include the {11-22}, {10-11}, and {10-13} planes. Other examples of semipolar planes in the wurtzite crystal structure include, but are not limited to, {10-12}, {20-21}, and {10-14}. The nitride crystal's polarization vector lies neither within such planes or normal to such planes, but rather lies at some angle inclined relative to the plane's surface normal. For example, the {10-11} and {10-13} planes are at 62.98° and 32.06° to the c-plane, respectively.

TECHNICAL DESCRIPTION

The present invention describes a new device structure for UV light emitting devices. A device, comprising one or more $Al_xIn_{1-x}N$, $Al_yIn_zGa_{1-y-z}N$, or $Al_{y'}In_{z'}Ga_{1-y'-z'}N$ layers, with $0 \leq y \leq 1$, $0 \leq z \leq 1$, $0 \leq y+z \leq 1$, $0 \leq y' \leq 1$, $0 \leq z' \leq 1$, and $0 \leq y'+z' \leq 1$, is grown on a non-polar or semi-polar GaN substrate via MOCVD.

Figure 1:
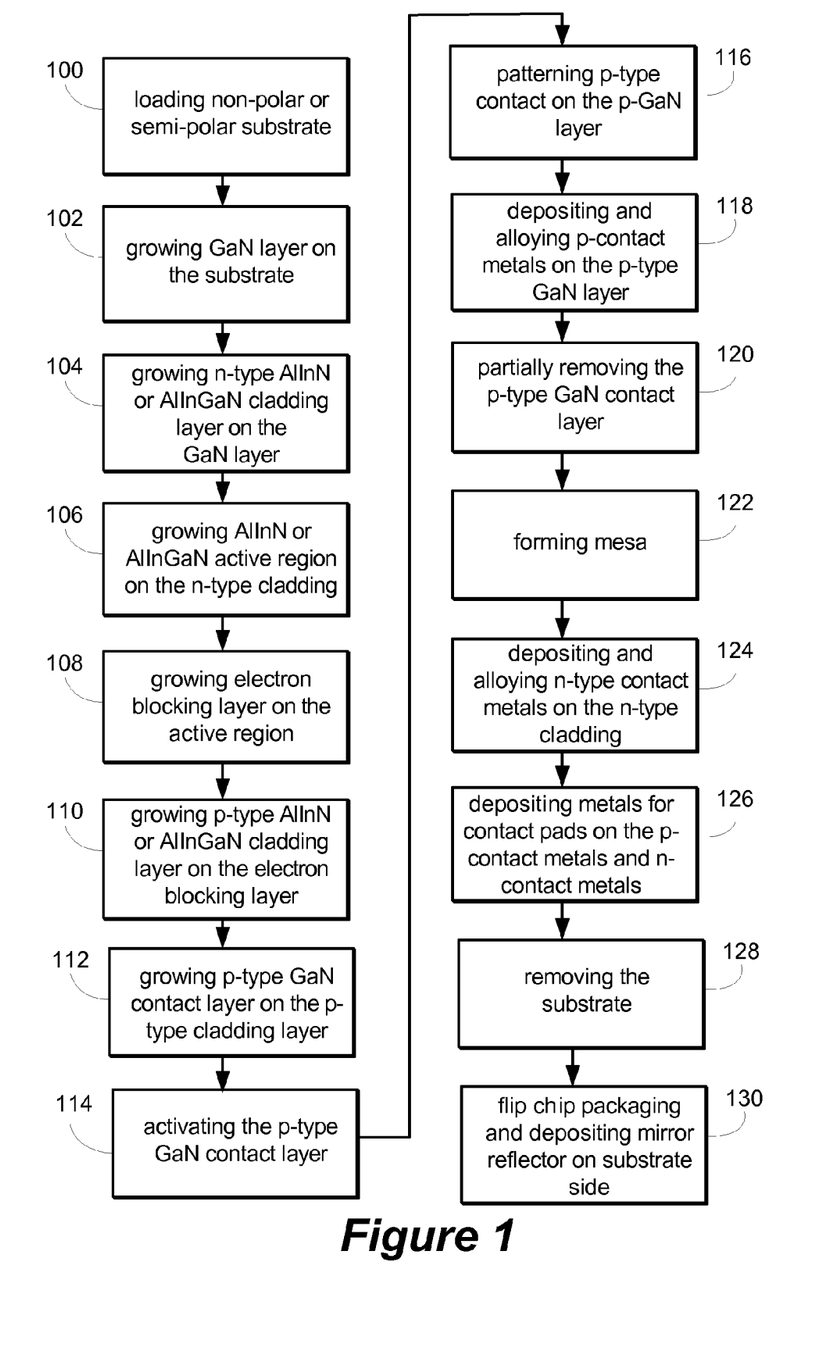
FIG. 1 is a flowchart illustrating a method of the present invention.

FIG. 1 is a flowchart illustrating a method of the present invention.

Block 100 represents the step of loading a substrate into a reactor. For the growth of a light emitting device structure, a bulk non-polar or semi-polar GaN substrate is loaded into a MOCVD reactor and a reactor pressure is set to a value between 5 torr and 760 torr.

Block 102 represents the step of growing a GaN layer on the substrate. The reactor's heater is turned on and ramped to a set point temperature, under hydrogen and/or nitrogen. Once the temperature reaches the set point, 1 μm to 3 μm thick unintentionally doped (UID) GaN or Si-doped GaN (by flowing DiSilane ($Si_2H_4$) into the reactor) is grown.

Then, as represented in block 104, the temperature is set to a value between 600° C. and 1000° C. and trimethyl-indium (TMIn), trimethyl-aluminum (TMAl), and ammonia ($NH_3$) are introduced into the reactor to grow an n-type AlInN or AlInGaN cladding layer on the GaN layer of block 102. Triethyl-gallium (TEGa) or trimethyl-gallium (TMGa) is used if the desired layer is a quaternary alloy. DiSilane is also flowed into the reactor for n-type doping. All the source flows are kept at a constant level until the cladding layer thickness reaches a minimum of 200 nm. An important condition is that the lattice parameter of the cladding layer must be closely matched to the lattice parameter of the GaN substrate to minimize the strain.

Thus, block 104 illustrates an example of epitaxially growing one of the $Al_xIn_{1-x}N$ or $Al_yIn_zGa_{1-y-z}N$ layers, e.g., as a first $Al_xIn_{1-x}N$ or $Al_yIn_zGa_{1-y-z}N$ layer having a first conductivity type, on a non-polar or semi-polar plane of the GaN substrate so that the first $Al_xIn_{1-x}N$ or $Al_yIn_zGa_{1-y-z}N$ layer is closely lattice matched to the non-polar or semi-polar GaN substrate.

Block 106 represents growth of the AlInN or AlInGaN active region on the n-type cladding grown in block 104. Once the desired n-type AlInN or AlInGaN cladding thickness is achieved, the reactor's temperature set point is decreased by 10° C. to 80° C. to incorporate more indium into the well region. Once the temperature reaches the set point, the AlInGaN barrier layer is grown. After the desired thickness is achieved, group III source flow rates and/or $NH_3$ flow rates can be either increased or decreased to obtain the desired composition of the AlInN or AlInGaN active layer. After growing the active layer (e.g. well layer) to the desired thickness, normally in between 3 nm and 10 nm, a barrier is grown on top. This forms a SQW. For example, the AlInN (active well layer)/AlInGaN (barrier), or AlInGaN (active layer)/AlInGaN (barrier) may be grown and the structure can be repeated to form a MQW. The indium composition may range from 10% to 30% to achieve a desired $\lambda_{peak}$. Possible MQW structures are shown in FIG. 2.

Figure 2A:
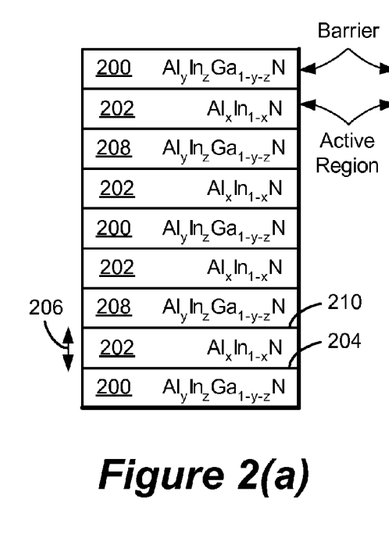
Figure 2B:
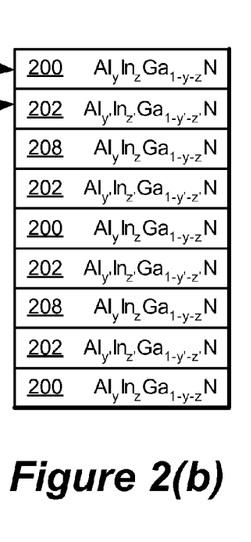
Figure 2C:
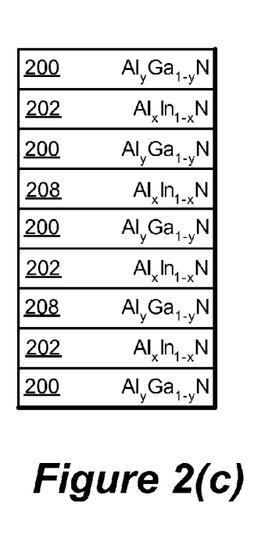

FIGS. 2(a), 2(b), and 2(c) illustrate epitaxially growing one of the $Al_xIn_{1-x}N$ or $Al_yIn_zGa_{1-y-z}N$ layers as a first $Al_xIn_{1-x}N$ or $Al_yIn_zGa_{1-y-z}N$ quantum well barrier layer 200, on a non-polar or semi-polar plane of the first $Al_xIn_{1-x}N$ or $Al_yIn_zGa_{1-y-z}N$ layer grown in block 104; epitaxially growing one of the $Al_xIn_{1-x}N$ or $Al_yIn_zGa_{1-y-z}N$ layers as an $Al_yIn_zGa_{1-y-z}N$ or $Al_xIn_{1-x}N$ quantum well layer 202, on a non-polar or semi-polar plane 204 of the first $Al_xIn_{1-x}N$ or $Al_yIn_zGa_{1-y-z}N$ quantum well barrier layer 200, and to a thickness 206 and an (Al,In,Ga)N composition that emits electroluminescence having a peak wavelength less than 360 nm; and epitaxially growing one of the $Al_xIn_{1-x}N$ or $Al_yIn_zGa_{1-y-z}N$ layers as a second $Al_xIn_{1-x}N$ or $Al_yIn_zGa_{1-y-z}N$ quantum well barrier layer 208, on a non-polar or semi-polar plane 210 of the $Al_xIn_{1-x}N$ or $Al_yIn_zGa_{1-y-z}N$ quantum well layer 202, thereby forming a quantum well structure comprising the $Al_xIn_{1-x}N$ or $Al_yIn_zGa_{1-y-z}N$ quantum well layer 202 between the first $Al_yIn_zGa_{1-y-z}N$ or $Al_xIn_{1-x}N$ quantum well barrier layer 200 and the second $Al_yIn_zGa_{1-y-z}N$ or $Al_xIn_{1-x}N$ quantum well barrier layer 208. In FIGS. 2(a)-(c), the structure is repeated to form a MQW having 4 periods.

In the example of FIG. 2(a), both the first quantum well barrier layer 200 and the second quantum well barrier layer 208 are $Al_yIn_zGa_{1-y-z}N$, and the quantum well 202 is $Al_xIn_{1-x}N$. In the example of FIG. 2(b), both the first quantum well barrier layer 200 and the second quantum well barrier layer 208 are $Al_yIn_zGa_{1-y-z}N$, and the quantum well 202 is $Al_yIn_zGa_{1-y-z}N$ with a different composition (e.g., $Al_{y'}In_{z'}Ga_{1-y'-z'}N$) from the barrier layers 200, 208. In the example of FIG. 2(c), both the first quantum well barrier layer 200 and the second quantum well barrier layer 208 are $Al_yGa_{1-y}N$, and the quantum well 202 is $Al_xIn_{1-x}N$. For example, at least one of the $Al_xIn_{1-x}N$ and $Al_yIn_zGa_{1-y-z}N$ layers 202 may be grown as a light emitting active layer with an indium composition ranging from 10% to 30%.

Block 108 represents growing an electron blocking layer (EBL), on the active region grown in block 106, wherein the compositions of group III species in the EBL are adjusted to obtain desired conduction band off-set between EBL and the barrier.

Block 110 represents the step of growing a p-type AlInN or AlInGaN cladding layer on the EBL layer grown in block 108. Once a desired EBL thickness is achieved, the reactor's set point temperature is increased by 10° C. to 80° C. Then, $Cp_2Mg$ is introduced into the reactor to achieve a p-type AlInN or AlInGaN layer. The compositions of the p-type alloys will be the same as that of the n-type alloys. Thus, block 110 illustrates an example of epitaxially growing one of the $Al_xIn_{1-x}N$ or $Al_yIn_zGa_{1-y-z}N$ layers, on the EBL of block 108 and quantum well structure of block 106, as a second $Al_xIn_{1-x}N$ or $Al_yIn_zGa_{1-y-z}N$ layer having a second conductivity type.

Then, as represented in Block 112, a p-type GaN contact layer is grown on the p-type cladding layer grown in block 110. For example, a thin and highly Magnesium (Mg)-doped p-type GaN layer may be grown on top to form a contact layer.

Once the reactor has cooled, the epitaxial wafer comprising a nitride device (formed in blocks 100-112) is removed and annealed in a hydrogen deficient ambient for 15 minutes, at a temperature of 700° C., in order to activate the p-type GaN contact layer grown in block 112 (Mg doped layers), as represented in Block 114.

The next step is to fabricate a device. The process for a UV LED is described here as an example. Once the epitaxial wafer is annealed, a photolithography technique is used to pattern the p-type contact (p-contact) on the wafer (patterning a p-type contact pattern on the p-GaN layer activated in block 114), as represented in Block 116. Then, p-contact metals (20 Å~100 Å Ni/Au) are deposited by an electron-beam evaporator and annealed under $N_2$ or $N_2/O_2$ ambient for 1 minute to 10 minutes to form a metal alloy, as represented in Block 118 (depositing and alloying p-contact metals on the patterned p-type GaN layer patterned in block 116). Then, the p-GaN contact layer is at least partially removed by a dry-etching technique, as represented in Block 120 (partially removing the p-type GaN contact layer resulting from blocks 114-118).

Figure 3:
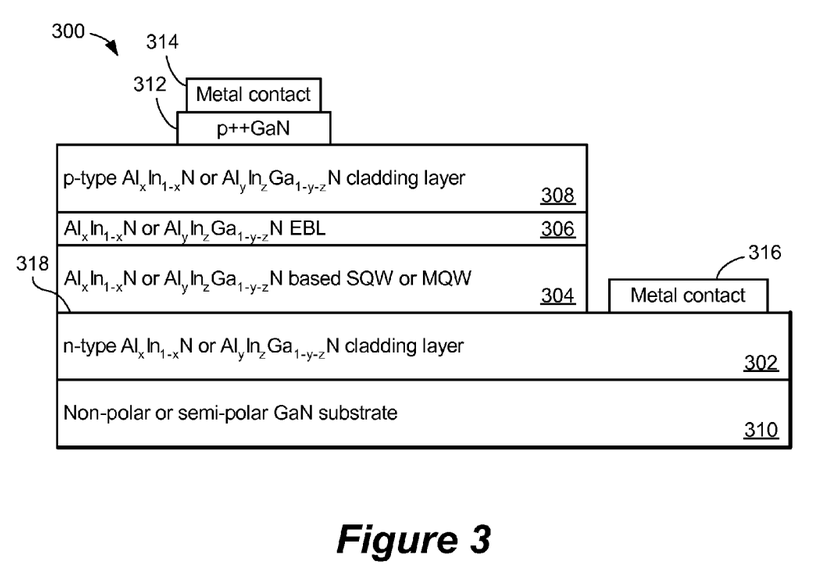
FIG. 3 is a cross-sectional schematic of a final structure of a non-polar or semi-polar UV LED, with emission wavelength ranging from 280 nm to 360 nm, and wherein the cladding layer is closely lattice-matched to the GaN substrate.

The step in Block 120 is to remove the light absorbing GaN layer resulting from blocks 114-118 and expose the p-type cladding layer grown in block 110, as shown in FIG. 3. After this step, a mesa is formed, in the structure resulting from blocks 100-120, by dry-etching, and the etching exposes the n-type cladding layer of block 104, as represented in Block 122. Then, n-type contact metals (Ti/Al/Ni/Au) are deposited and annealed under $N_2$ or $N_2/O_2$ ambient for 1 minute to 10 minutes to form a metal alloy, as represented in Block 124 (depositing and alloying n-type contact metals on the n-type cladding layer grown in block 104 and exposed in block 122). Metals for the contact pads are then deposited using an electron-beam evaporator, as represented by Block 126 (depositing metals for contact pads on the alloyed p-contact metals and alloyed n-contact metals of blocks 118 and 124, respectively).

Then, the substrate of block 100 is typically removed, as represented by block 128 (removing the substrate). Finally, flip chip packaging is typically performed, and a mirror reflector is typically deposited on the side of the device exposed by the substrate removal of block 128.

FIG. 3 shows an example of a final optoelectronic device 300 (e.g., LED or LD) structure obtained after implementing the steps discussed above, comprising one or more $Al_xIn_{1-x}N$ or $Al_yIn_zGa_{1-y-z}N$ layers 302, 304, 306, and 308, with $0 \le y \le 1$, $0 \le z \le 1$, and $0 \le y+z \le 1$, fabricated (e.g., grown) on a non-polar or semi-polar GaN substrate 310 (as shown in e.g., blocks 104, 106, 108 and 110), wherein the $Al_xIn_{1-x}N$ or $Al_yIn_zGa_{1-y-z}N$ layers 302, 304, 306, and 308 are non-polar or semi-polar (i.e., grown in a non-polar or semi-polar direction so that a growth surface of the layers 302, 304, 306, and 308 is a non-polar plane (e.g., m-plane or a-plane) or semi-polar plane of III-Nitride.

All the layers 302, 304, 306, and 308 contain at least some Indium. The $Al_xIn_{1-x}N$ or $Al_yIn_zGa_{1-y-z}N$ layers 302, 304, 306, and 308 may comprise at least Al, In and N, for example.

For example, one or more of the $Al_xIn_{1-x}N$ or $Al_yIn_zGa_{1-y-z}N$ layers are closely lattice-matched to the non-polar or semi-polar GaN substrate 310 (e.g., an $Al_xIn_{1-x}N$ or $Al_yIn_zGa_{1-y-z}N$ based n-type cladding layer 302 on the non-polar or semi-polar GaN substrate 310), one or more of the $Al_xIn_{1-x}N$ or $Al_yIn_zGa_{1-y-z}N$ layers are doped with Si for n-type conductivity (e.g., the n-type cladding layer doped with silicon 302), one or more of the $Al_xIn_{1-x}N$ or $Al_yIn_zGa_{1-y-z}N$ layers are doped with Mg for p-type conductivity (a p-type cladding layer doped with Mg 308), a plurality of the $Al_xIn_{1-x}N$ or $Al_yIn_zGa_{1-y-z}N$ layers 302, 304, 306, and 308 form one or more heterostructures or one or more quantum-well heterostructures 304 (e.g., an $Al_xIn_{1-x}N$ or $Al_yIn_zGa_{1-y-z}N$ based SQW or MQW 304 on the n-type cladding layers 302). In one example, an indium composition of one or more of the $Al_xIn_{1-x}N$ or $Al_yIn_zGa_{1-y-z}N$ 304 layers ranges from 10% to 30%.

The device 300 of FIG. 3 further comprises one or more $Al_xIn_{1-x}N$ or $Al_yIn_zGa_{1-y-z}N$ based electron blocking layers (EBLs) 306 on the quantum well layers 304. The $Al_xIn_{1-x}N$ or $Al_yIn_zGa_{1-y-z}N$ based p-type cladding layer 308 is on the one or more EBLs 306. Also shown is a $p^{++}$ GaN contact layer 312 on the p-type cladding layer 308, a metal contact 314 to the $p^{++}$ GaN contact layer 312 and a metal contact 316 to the n-type cladding layer 302.

Layer 302 is typically closely lattice matched to the substrate. "Closely lattice-matched" is close enough that there is no relaxation of the film at the thicknesses grown. No relaxation means no more dislocations than the dislocations from the substrate 310.

Thus, FIGS. 2(a), 2(b), 2(c), and 3 illustrate an optoelectronic device 300, comprising one or more light emitting layers 202, 304 containing at least Al, In, and N, grown on a non-polar or semi-polar GaN substrate 310, wherein the light emitting layers 202, 304 are non-polar or semi-polar layers.

FIGS. 2(a), 2(b), 2(c) and 3 also illustrate a first (Al,In,Ga)N layer having a first conductivity type 302 (e.g., but not limited to, n-type); a second (Al,In,Ga)N layer having a second conductivity type 308 (e.g., but not limited to, p-type); an (Al,In,Ga)N quantum-well structure 304 comprising an (Al,In,Ga)N quantum well layer 202 epitaxially on a non-polar or semi-polar plane 204 of a first (Al,In,Ga)N quantum well barrier layer 200, and a second (Al,In,Ga)N quantum well barrier layer 208 epitaxially on a non-polar or semi-polar plane 210 of the (Al,In,Ga)N quantum well layer 202, wherein (1) the quantum well structure 304 is epitaxially on a non-polar or semi-polar plane 318 of an (Al,In,Ga)N layer (e.g., the first (Al,In,Ga)N layer 302) such that the (Al,In,Ga)N quantum well structure 304 is between the first (Al,In,Ga)N layer 302 and the second (Al,In,Ga)N layer 308, and the quantum well 202 has a thickness 206 and (Al,In,Ga)N composition that emits electroluminescence having a peak wavelength less than 360 nm. For example, the device 300 may be a light emitting device having a peak emission wavelength ranging from 280 nm to 360 nm.

The (Al,In,Ga)N layer 302 is typically grown on a non-polar or semi-polar plane 320 of the substrate 310. Even after the substrate 310 is subsequently removed (see, e.g., block 128 of FIG. 1), layer 302 retains the dislocation density associated with epitaxial growth on GaN. As a result, the (Al,In,Ga)N quantum well structure 304 is epitaxially on an (Al,In,Ga)N layer 302, wherein the (Al,In,Ga)N layer 302 has a low dislocation density of an (Al,In,Ga)N layer that is grown epitaxially on, and closely lattice matched to, GaN (e.g., substrate 310), even after the substrate 310 is removed. The (Al, In, Ga)N layers 302 may have a dislocation density of less than $10^6$ cm$^{-2}$, wherein the (Al,In,Ga)N layer 302 (and/or layers between layer 302 and the substrate 310, and/or layers 304, 306, and 308) do not comprise a lateral epitaxial overgrowth.

With the sufficiently low dislocation density and the relatively high Indium composition of (Al, In, Ga)N, the active region (light emitting region) 304 could achieve an IQE of the light emitting device 300 of greater than 15%, which was the value obtained by an $Al_xIn_yGa_{1-x-y}N$ alloy with Indium contents (y) less than 10%. Therefore, it is possible to achieve an external quantum efficiency of the light emitting device 300 of greater than 1%.

In general, the dislocations such as edge type dislocations and screw type dislocations are known to be a trap that provides nonradiative recombination sites. More dislocations means more nonradiative recombination and hence lower IQE. Therefore, external quantum efficiency drops (external quantum efficiency=IQE times extraction efficiency).

Details of the fabrication process need to be modified for other UV emitting devices, such as a laser diode.

In order to enhance the utility of the present invention, it is important that the device is grown on a bulk GaN substrate, which has the minimum possible dislocations. A Bulk GaN substrate is essentially a thick GaN that is free standing. One example would be a thick (~300 µm) GaN grown on a sapphire, which then is lifted-off from the sapphire substrate.

However, the GaN substrate is an absorbing layer for the emission wavelength lower than 360 nm. Therefore, it is necessary to remove the GaN substrate to improve the light extraction, as represented in Block 128. The GaN substrate can be removed by lapping, polishing, and dry-etching processes. Then, flip-chip packaging with a mirror reflector (as represented in Block 130) can maximize light extraction from the light emitting device, such as the LEDs described above.

POSSIBLE MODIFICATIONS

Although the growth specification for the devices described above utilized heteroepitaxial growth of non-polar and semi-polar AlInN and AlInGaN layers by MOCVD, the present invention can use any growth techniques. For example, non-polar and semi-polar AlInN and AlInGaN could also be grown by molecular beam epitaxy (MBE) with the proper growth conditions.

Instead of using a dry-etching technique to remove the GaN substrate, a very thin InGaN layer can be deposited prior to the growth of the n-type cladding layer. After a device is grown, the InGaN layer can be etched away by photoelectrochemical (PEC) etching using a UV light source.

The growth process described above is only one set of possible growth conditions based on preliminary experiments. Growth conditions such as gas flows, growth pressure, and growth temperature can be further explored to grow non-polar and semi-polar AlInN and AlInGaN layers. Further information on growth of AlInN can be found in [6].

ADVANTAGES AND IMPROVEMENTS

The existing practice is to grow AlGaN-based UV emitting devices on a c-plane sapphire or SiC substrate in which the surface is either Ga (Al)-face or N-face. The plane normal to the c-direction has spontaneous polarization due to the large electronegativity difference. Hence, the interface between multi-layers of different polarization inherently builds up the polarization charge and results in an internal electric field. This electric field can be significantly large for thin layers such as an active layer and changes the energy band structure. Lattice mismatch between substrates and subsequent layers (AlN and AlGaN) introduces a piezoelectric polarization, which could further change the band structure.

The present invention describes a device structure that has minimized both the spontaneous and piezoelectric polarizations. Spontaneous polarization is decreased by growing a device in a non-polar or semi-polar crystal orientation. More importantly, reduction in piezoelectric polarization is achieved by growing AlInN or AlInGaN cladding layers closely lattice-matched to the GaN substrate. Only the quantum-well layers are slightly under the compressive strain. The lattice-matching condition also means there are no additional dislocations arising from the interface between the cladding layer and the substrate. Therefore, the reduction of both the QCSE effect and dislocation density will result in higher IQE. Improved crystal quality also means that high-power and high-efficiency LDs in the UV region can be realized. Because the non-polar and semi-polar bulk GaN substrates are available with high crystal quality, the new structure described in the present invention is expected to more efficient than the state-of-art UV emitting devices that are currently available.

REFERENCES

The following references are incorporated by reference herein:

[1] T. Nishida, H. Saito, and N. Kobayashi, Appl. Phys. Lett. 78, 399 (2001).

[2] H. Hirayama, T. Yatabe, N. Noguchi, T. Ohashi, and N. Kamata, Appl. Phys. Lett. 91, 071901 (2007).

[3] D. S. Kamber, Y. Wu, E. Letts, S. P. DenBaars, J. S. Speck, S, Nakamura, and S. A. Newman, Appl. Phys. Lett. 90, 122116 (2007).

[4] G. A. Slack and T. F. McNelly, J. Crys. Growth 34, 263 (1976).

[5] H. Hirayama, J. Appl. Phys. 97, 091101 (2005).

[6] R. B. Chung, Z. Chen, S. Keller, J. S. Speck, S. P. DenBaars, and S, Nakamura, "effect of growth conditions on Indium incorporation during AlInN growth by MOCVD and characterization", 36th international symposium on compound semiconductors, August 2009, Santa Barbara, Calif., USA.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A device structure, comprising:
   one or more active layers, wherein:
      the active layers are III-nitride layers including at least Aluminum (Al) and Indium (In),
      the active layers are non-polar or semi-polar layers, and
      the active layers emit electroluminescence having a peak emission at a wavelength of 360 nanometers or less.

2. The device structure of claim 1, wherein the active layers have a dislocation density of less than $10^6$ cm$^{-2}$.

3. The device structure of claim 1, wherein the active layers are grown upon a non-polar or semi-polar III-nitride substrate and the active layers contain no more dislocations than the non-polar or semi-polar III-nitride substrate.

4. The device structure of claim 3, wherein the active layers are removed from the non-polar or semi-polar III-nitride substrate after epitaxial and lattice matched growth of the active layers.

5. The device structure of claim 3, wherein the substrate is a Gallium Nitride (GaN) substrate.

6. The device structure of claim 5, wherein one or more of (1) the GaN substrate, and (2) a p-type GaN layer in the device structure, that absorb the electroluminescence, are removed from the device structure.

7. The device structure of claim 1, wherein the active layers are not relaxed.

8. The device structure of claim 1, wherein the active layers are lattice matched to, and epitaxially on or above, a III-nitride underlayer or substrate.

9. The device structure of claim 8, wherein the substrate is a non-polar or semi-polar Gallium Nitride (GaN) substrate and the III-nitride underlayer is an $Al_xIn_{1-x}N$ or $Al_yIn_zGa_{1-y-z}N$ layer with $0 \leq y \leq 1$, $0 \leq z \leq 1$, and $0 \leq y+z \leq 1$.

10. The device structure of claim 1, wherein the active layers have no more dislocations than is characteristic of layers that are:
   epitaxially on or above a III-nitride underlayer or substrate, and
   lattice matched to the III-nitride underlayer or substrate, or not relaxed.

11. The device structure of claim 10, wherein the substrate is a non-polar or semi-polar Gallium Nitride (GaN) substrate and the III-nitride underlayer is an $Al_xIn_{1-x}N$ or $Al_yIn_zGa_{1-y-z}N$ layer with $0 \leq y \leq 1$, $0 \leq z \leq 1$, and $0 \leq y+z \leq 1$.

12. The device structure of claim 1, further comprising:
   one or more n-type $Al_xIn_{1-x}N$ or $Al_yIn_zGa_{1-y-z}N$ layers, with $0 \leq y \leq 1$, $0 \leq z \leq 1$, and $0 \leq y+z \leq 1$,
   one or more p-type $Al_xIn_{1-x}N$ or $Al_yIn_zGa_{1-y-z}N$ layers, with $0 \leq y \leq 1$, $0 \leq z \leq 1$ and $0 \leq y+z \leq 1$,
   wherein the active layers are between the n-type $Al_xIn_{1-x}N$ or $Al_yIn_zGa_{1-y-z}N$ layers and the one or more p-type $Al_xIn_{1-x}N$ or $Al_yIn_zGa_{1-y-z}N$ layers.

13. The device structure of claim 12, wherein:
   the one or more n-type $Al_xIn_{1-x}N$ or $Al_yIn_zGa_{1-y-z}N$ layers, or
   the one or more p-type $Al_xIn_{1-x}N$ or $Al_yIn_zGa_{1-y-z}N$ layers,
   are epitaxially on or above a non-polar or semi-polar substrate or a non-polar or semi-polar GaN substrate.

14. The device structure of claim 13, wherein:
   the one or more n-type $Al_xIn_{1-x}N$ or $Al_yIn_zGa_{1-y-z}N$ layers or
   the one or more p-type $Al_xIn_{1-x}N$ or $Al_yIn_zGa_{1-y-z}N$ layers,
   are closely lattice-matched to the non-polar or semi-polar substrate or the non-polar or semi-polar GaN substrate.

15. The device structure of claim 1, wherein the active layers have an Indium composition ranging from 10% to 30%.

16. The device structure of claim 15, wherein the active layers form one or more quantum-well heterostructures.

17. The device structure of claim 16, wherein:
   the active layers are epitaxially on a semi-polar or non-polar plane of a III-nitride layer, and
   the III-nitride layer has a dislocation density of a III-nitride layer that is grown epitaxially on, and closely lattice matched to, Gallium Nitride (GaN).

18. The device structure of claim 1, wherein
   the device structure is a Light Emitting Diode structure or Laser Diode structure
   the active layer is epitaxially on a non-polar or semi-polar plane of a III-nitride layer, and
   a dislocation density of the III-nitride layer that is sufficiently low, such that the non-polar or semi-polar plane and the dislocation density achieve an internal quantum efficiency of the device of greater than 15% and an external quantum efficiency of the device of greater than 1%.

19. The device structure of claim 1, wherein the peak emission is at the wavelength ranging from 280 nm to 360 nm.

20. The device structure of claim 1, wherein the device structure emits the light with an internal quantum efficiency greater than 15% and an external quantum efficiency greater than 1%.

21. The device structure of claim 3, wherein the active layers are the non-polar layers and the substrate is the non-polar substrate.

22. The device structure of claim 3, wherein the active layers are the semi-polar layers and the substrate is the semi-polar substrate.

23. A method of fabricating a device structure, comprising:
   epitaxially growing one or more III-nitride layers on or above a non-polar or semi-polar plane of a III-nitride substrate, wherein the III-nitride layers are not relaxed;

epitaxially growing one or more active layers on or above the III-nitride layers, wherein:
   the active layers are III-nitride layers including at least Aluminum (Al) and Indium (In),
   the active layers are non-polar or semi-polar layers, and
   the active layers emit electroluminescence having a peak emission at a wavelength of 360 nanometers or less.

24. The method of claim 23, further comprising removing at least some of the substrate.

25. The method of claim 23, wherein the substrate is a Gallium Nitride (GaN) substrate.

26. The method of claim 23, wherein the active layers are the non-polar layers and the plane is the non-polar plane.

27. The method of claim 23, wherein the active layers are the semi-polar layers and the plane is the semi-polar plane.

* * * * *